(12) United States Patent
Yamaguchi

(10) Patent No.: US 7,698,087 B2
(45) Date of Patent: Apr. 13, 2010

(54) SEMICONDUCTOR INTEGRATED CIRCUIT AND TESTING METHOD OF SAME

(75) Inventor: Kota Yamaguchi, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 98 days.

(21) Appl. No.: 11/892,357

(22) Filed: Aug. 22, 2007

(65) Prior Publication Data

US 2008/0048703 A1  Feb. 28, 2008

(30) Foreign Application Priority Data

Aug. 25, 2006  (JP) ............... 2006-229578

(51) Int. Cl.
*G06F 11/00* (2006.01)
*G06F 19/00* (2006.01)

(52) U.S. Cl. .............. 702/117; 73/865.9; 324/73.1; 324/500; 324/537; 324/765; 702/108; 702/120; 714/1; 714/25; 714/100

(58) Field of Classification Search ............ 73/432.1, 73/865.8, 865.9; 324/73.1, 158.1, 500, 512, 324/537, 765; 702/1, 108, 117, 118, 120, 702/127, 182, 183, 186, 187, 188, 189; 714/1, 714/25, 27, 100
See application file for complete search history.

(56) References Cited

U.S. PATENT DOCUMENTS

| | | | | |
|---|---|---|---|---|
| 2,883,255 A * | 4/1959 | Anderson | ............ | 346/34 |
| 2,950,437 A * | 8/1960 | Stahl | ............ | 324/73.1 |
| 2,996,666 A * | 8/1961 | Baker | ............ | 324/73.1 |
| 3,219,927 A * | 11/1965 | Topp, Jr. et al. | ............ | 714/735 |
| 3,487,304 A * | 12/1969 | Kennedy | ............ | 324/73.1 |
| 6,356,498 B1 | 3/2002 | Keeth | | |
| 2004/0153732 A1 | 8/2004 | Kamata | | |
| 2006/0023544 A1* | 2/2006 | Yamada | ............ | 365/222 |

FOREIGN PATENT DOCUMENTS

| | | |
|---|---|---|
| JP | 3-225850 | 10/1991 |
| JP | 5-54694 A | 3/1993 |
| JP | 7-030068 | 1/1995 |
| JP | 10-125742 | 5/1998 |
| JP | 11-243124 | 9/1999 |
| JP | 2001-014886 A | 1/2001 |

OTHER PUBLICATIONS

Euroepan Search Report dated Oct. 8, 2009, 10 pages.

* cited by examiner

*Primary Examiner*—Edward R Cosimano
(74) *Attorney, Agent, or Firm*—Arent Fox LLP

(57) ABSTRACT

A program circuit activates a pass signal when a first program unit is programmed. The first program unit is programmed when a test of an internal circuit is passed. A mode setting circuit switches an operation mode to a normal operation mode or a test mode by external control. A state machine allows a partial circuit of the internal circuit to perform an unusual operation different from a normal operation when the pass signal is inactivated during the normal operation mode. By recognizing the unusual operation during the normal operation mode, it can be easily recognized that a semiconductor integrated circuit is bad. Since a failure can be recognized without shifting to the test mode, for example, a user who purchases the semiconductor integrated circuit can also easily recognize the failure.

14 Claims, 13 Drawing Sheets

| TESZ | PASZ | NRMZ | operation of circuit 4a |
|---|---|---|---|
| H (test mode) | H (good chip) | H | normal operation |
| H (test mode) | L (bad chip) | H | normal operation |
| L (normal operation mode) | H (good chip) | H | normal operation |
| L (normal operation mode) | L (bad chip) | L | unusual operation |

Fig. 2

| TESZ | PASZ | ENZ | LPZ | LPCNTZ |
|---|---|---|---|---|
| H (test mode) | H (good chip) | H | H | H |
| | | | L | L |
| | L (bad chip) | H | H | H |
| | | | L | L |
| | H (good chip) | H | H | H |
| | | | L | L |
| | L (bad chip) | | H | L |
| L (normal operation mode) | | L | L | L |

Fig. 7

SEMICONDUCTOR INTEGRATED CIRCUIT AND TESTING METHOD OF SAME

CROSS REFERENCE TO RELATED APPLICATION

This application is based upon and claims the benefit of priority from Japanese Patent Application No. 2006-229578, filed on Aug. 25, 2006, the entire contents of which are incorporated herein by reference.

BACKGROUND

1. Field

The present invention relates to a semiconductor integrated circuit including a program circuit of a fuse or the like and a testing method of the same.

2. Description of the Related Art

Generally, after being manufactured, a semiconductor integrated circuit (hereinafter also referred to a chip) is tested and classified as a good chip or a bad chip. A technique of programming a fuse of a bad chip to electrically identify the good chip or the bad chip in a manufacturing process is proposed (for example, Japanese Unexamined Patent Application Publication No. Hei 7-30068, Japanese Unexamined Patent Application Publication No. Hei 11-243124, Japanese Unexamined Patent Application Publication No. Hei 3-225850). Further, a technique of programming a fuse of the good chip to make it possible to electrically identify the good chip or the bad chip in a test mode is proposed (for example, Japanese Unexamined Patent Application Publication No. Hei 10-125742).

Recently, not only the shipment of a packaged chip but also the shipment of chips in a wafer state tends to increase. In this case, a wafer on which good and bad chips are mixed is shipped. In wafer shipment, for example, the surface of the bad chip is marked with ink. Alternatively, a failure map file indicating the position of the bad chip on the wafer is created.

However, if the position of the ink mark is shifted by one chip, the ink mark becomes faint, or a wrong failure map file is created due to a problem in the manufacturing process, a user who has purchased the wafer may be unable to identify the good and bad chips. Further, when a chip which caused the above problem is returned from the user to a semiconductor maker, a long time is sometimes needed to analyze a failure.

Programming the fuse of the bad chip or the good chip is performed to identify the good chip or the bad chip in the manufacturing process of the semiconductor integrated circuit, but does not give consideration to the user who purchases the semiconductor integrated circuit. In order for the user to investigate a program state of the fuse and identify the good chip or the bad chip, the user needs to apply a voltage to a special test terminal (pad) or shift the chip to the test mode.

Further, for example, if only one memory cell is bad in the bad chip, most circuits in the bad chip normally operate. Therefore, it is difficult for the user to identify the good and bad chips in the state where the wrong ink mark is put or the wrong failure map file is created. In particular, in the wafer shipment in which the bad chip is mixed, after a product in which the chip is mounted is assembled by the user, the failure in the chip is sometimes revealed in a test process of the product. After the product is assembled, the ink mark and the failure map file cannot be referred to. Hence, it is difficult for the user to identify whether the chip is shipped as the good chip.

SUMMARY

An object of the present invention is to easily identify whether a semiconductor integrated circuit is a good product or not.

In one aspect of the present invention, a program circuit activates a pass signal when a first program unit is programmed. The first program unit is programmed when a test of an internal circuit is passed. A mode setting circuit switches an operation mode to a normal operation mode or a test mode by external control. A state machine allows a partial circuit of the internal circuit to perform an unusual operation different from a normal operation when the pass signal is inactivated during the normal operation mode. Here, the unusual operation is an operation recognizable from outside a semiconductor integrated circuit. By recognizing the unusual operation in the normal operation mode, it can be easily recognized that the semiconductor integrated circuit is bad. Since a failure can be recognized without shifting to the test mode, for example, a user who purchases the semiconductor integrated circuit can also easily recognize the failure.

Further, the state machine disables the unusual operation of the partial circuit and allows it to perform the normal operation during the test mode or when the pass signal is activated. During the test mode, the unusual operation is disabled regardless of a program state of the first program unit. Therefore, for example, a maker of the semiconductor integrated circuit can easily perform a test of the semiconductor integrated circuit by switching the operation mode from the normal operation mode to the test mode in a test process even when the first program unit is not programmed. Then, in a programming process, only in the semiconductor integrated circuit which has passed the test, the first program unit is programmed.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 2 is an explanatory diagram showing the operation of a state machine shown in FIG. 1;

FIG. 7 is an explanatory diagram showing details of the state machine shown in FIG. 5;

DETAILED DESCRIPTION OF THE EMBODIMENTS

Figure 1:
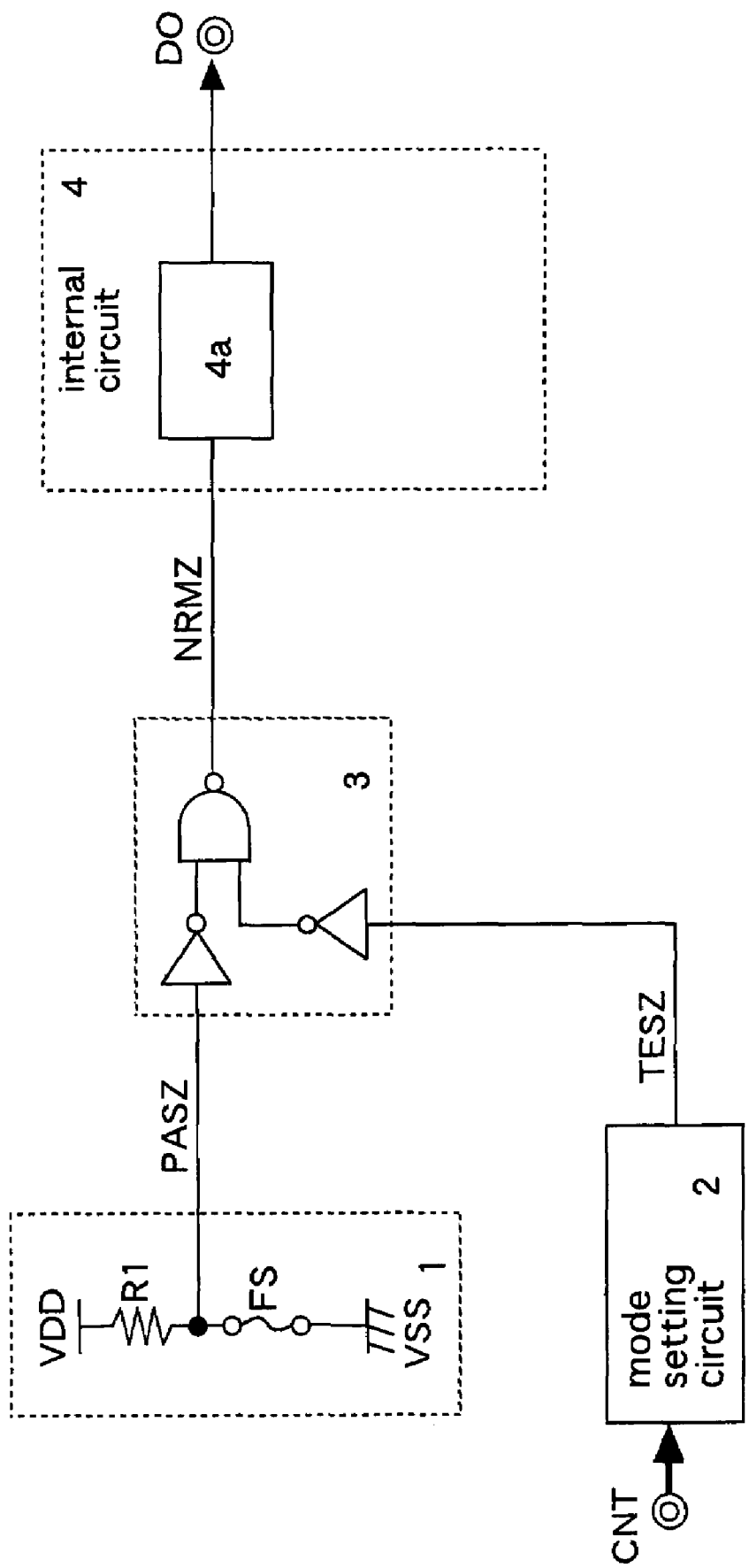
FIG. 1 is a block diagram showing a first embodiment of the present invention.

Hereinafter, embodiments of the present invention will be described, using the drawings. In the drawings, each signal line shown by the heavy line is constituted of a plurality of lines. Further, part of blocks to which the heavy lines are connected is constituted of a plurality of circuits. Each signal line through which the signal is transmitted is denoted by the same reference symbol as the signal name. Each signal starting with "/" represents negative logic. Each signal ending with "Z" represents positive logic. Each double circle in the drawings represents an external terminal.

FIG. 1 shows a first embodiment of the present invention. A semiconductor integrated circuit includes a program circuit 1, a mode setting circuit 2, a state machine 3, and an internal circuit 4. The program circuit 1 includes a resistor R1 and a fuse FS (first program unit) connected in series between a power supply line VDD and a ground line VSS. The fuse FS is programmed (cut) when a test of the internal circuit 4 is passed. For example, the fuse FS is a fuse programmed by irradiation of a laser beam. Alternatively, the fuse FS is a fuse programmed by an overvoltage or an overcurrent. Further, the fuse FS may be constituted using an electrically programmable nonvolatile memory cell.

The program circuit 1 activates a pass signal PASZ outputted from a connection node between the resistor R1 and the fuse FS to a high logic level when the fuse FS is programmed. The program circuit 1 inactivates the pass signal PASZ to a low logic level when the fuse FS is not programmed. As will be described in FIG. 3, the fuse FS is programmed when it is confirmed by a test that the semiconductor integrated circuit operates normally. Incidentally, the program circuit 1 is not limited to having a circuit configuration of FIG. 1. For example, it may have a circuit configuration in which no feedthrough current flows when the fuse FS is not programmed.

The mode setting circuit 2 activates a test mode signal TESZ to a high logic level when a control signal CNT supplied from outside the semiconductor integrated circuit via an external terminal indicates a shift from a normal operation mode to a test mode. The mode setting circuit 2 inactivates the test mode signal TESZ to a low logic level when the control signal CNT indicates a shift from the test mode to the normal operation mode.

The state machine 3 calculates the OR logic of the pass signal PASZ and the test mode signal TESZ and outputs a calculation result as a normal signal NRMZ. For example, the normal signal NRMZ is activated to a high logic level during the test mode (TESZ=high logic level) or when the pass signal PASZ is activated. The normal signal NRMZ is inactivated during the normal operation mode (TESZ=low logic level) or when the pass signal PASZ is inactivated to the low logic level.

A partial circuit 4a of the internal circuit 4 performs a normal operation when the normal signal NRMZ is activated and performs an unusual operation when the normal signal NRMZ is inactivated. As just described, the state machine 3 allows the circuit 4a to perform the normal operation or the unusual operation according to the logic level of the normal signal NRMZ. For example, the unusual operation is an operation consuming a larger power supply current compared to the normal operation. Alternatively, the unusual operation is an operation of disabling an output of data to be outputted to a data output terminal DO or an operation of outputting a signal with a logic different from that during the normal operation to the data output terminal DO. These unusual operations are recognizable from outside the semiconductor integrated circuit by measuring the power supply current or monitoring the data output terminal DO.

FIG. 2 shows the operation of the state machine 3 shown in FIG. 1. During the normal operation mode (TESZ=L), the normal signal NRMZ is set to the same level as the logic level of the pass signal PASZ. Namely, when the semiconductor integrated circuit is a bad chip (PASZ=L (low logic level)), the circuit 4a performs the unusual operation during the normal operation mode. On the other hand, during the test mode (TESZ=H (high logic level)), the normal signal NRMZ is always activated regardless of the logic of the pass signal PASZ. Namely, the circuit 4a always performs the normal operation during the test mode regardless of a bad chip or a good chip.

Figure 3:
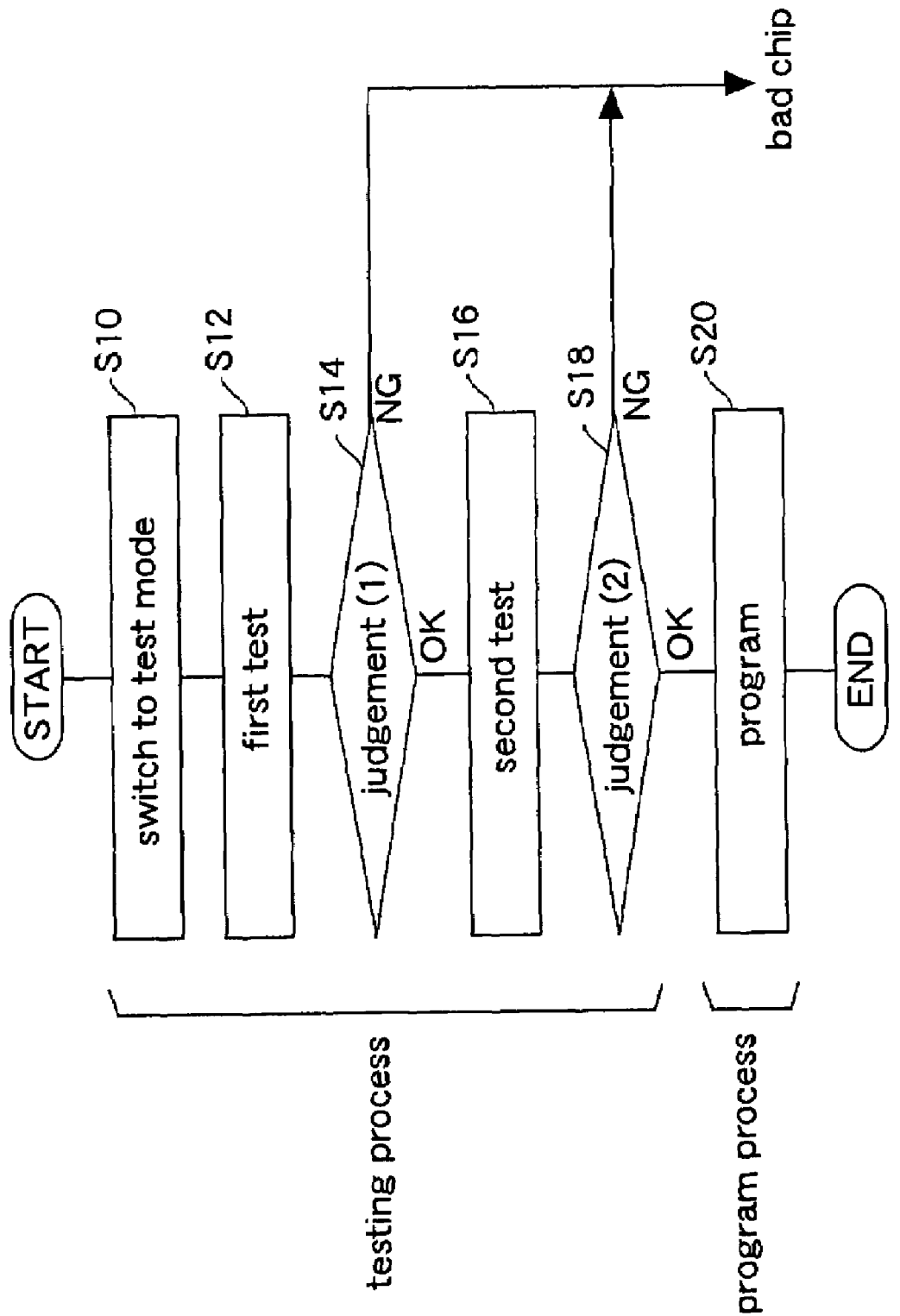
FIG. 3 is a flowchart showing a testing method of a semiconductor integrated circuit of the first embodiment.

FIG. 3 shows a flow of a testing method of the semiconductor integrated circuit of the first embodiment. This flow is performed in a manufacturing process of the semiconductor integrated circuit. The semiconductor integrated circuit to be tested may be in any of a wafer state, a chip state, and a packaged state. Steps S10-S18 are a test process using an LSI tester or the like. A first process of step S12 and a second test process of step S16 are sub-test processes. Step S20 is a programming process using a programming apparatus of the fuse FS.

First, in step S10, the control signal CNT is supplied to the semiconductor integrated circuit. The semiconductor integrated circuit is switched from the normal operation mode to the test mode. Then, in step S12, the first test process of testing the internal circuit of the semiconductor integrated circuit is performed. Subsequently, in step S14, it is judged based on a result of the first test process whether the semiconductor integrated circuit is a good chip (OK) or a bad chip (NG). If the semiconductor integrated circuit is in the wafer state, the bad chip is marked with ink. Alternatively, a failure map file indicating the position of the bad chip on a wafer is created. When the semiconductor integrated circuit is in the chip state or the package state, the bad chip is discarded. If the semiconductor integrated circuit is a good chip (i.e., OK), the good integrated circuit will continue a second test process in step S16.

In step S16, the second test process of testing the internal circuit in detail is performed. When plural chips on the wafer are simultaneously tested in the second test process, the test is performed without distinction between good and bad chips. On the other hand, when the test is performed on each chip, the test is performed only on good chips. Next, in step S18, it is judged based on a result of the second test process whether the semiconductor integrated circuit is a good chip or a bad chip. Similar to the step S14, if the semiconductor integrated circuit is a bad chip (NG), the bad chip is marked with ink or a failure map file indicating the position of the bad chip on a wafer is created. If the semiconductor integrated circuit is a good chip (OK), the process continues the step S20. Then, in step S20, only in the semiconductor integrated circuit (good chip) which has passed the test, the fuse FS is programmed. Subsequently, the semiconductor integrated circuit is shipped. By performing the programming process after at last second test process out of plural sub-test process, the fuse FS is programmed only in all good chips. Accordingly, during the normal operation mode, all the good chips perform the normal operation, and all bad chips perform the unusual operation.

Figure 4:
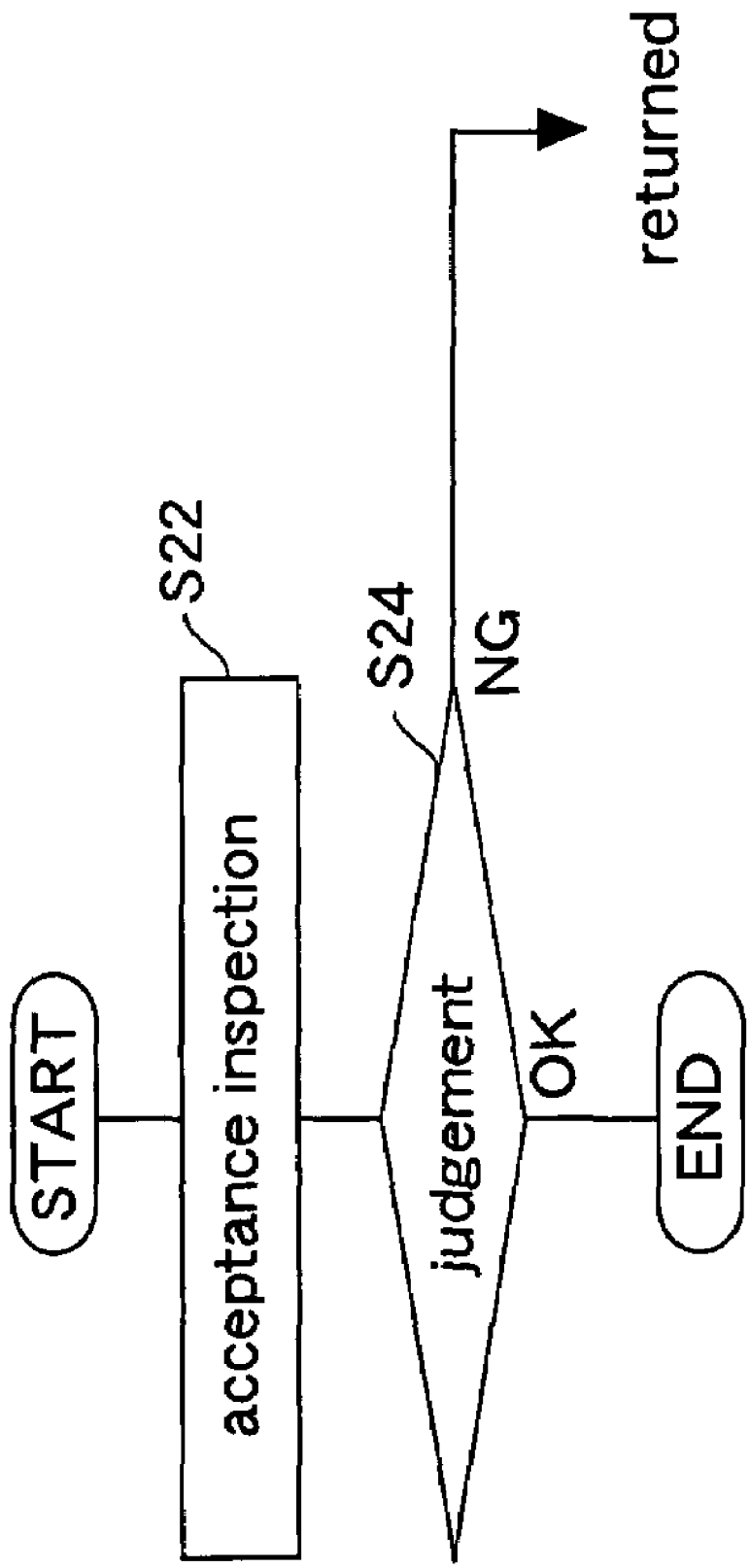
FIG. 4 is a flowchart showing an acceptance inspection by a user who has purchased the semiconductor integrated circuit.

FIG. 4 shows a flow of an acceptance inspection by a user who has purchased the semiconductor integrated circuit. In the acceptance inspection, the semiconductor integrated circuit is subjected to a simple test to confirm the presence or absence of the above unusual operation in the normal operation mode. The normal operation mode is an operation mode when the semiconductor integrated circuit is powered on and does not need setting by the user.

First, in step S22, the simple test of the semiconductor integrated circuit is performed. In this test, the bad semiconductor integrated circuit exhibits an unusual power supply current or unusual output data. Therefore, the user can easily identify the good chip or the bad chip. For example, when the semiconductor integrated circuit is shipped in the wafer state, the bad chip is shipped together with the good chips. If the position of the ink mark is shifted by one chip or a wrong map file is created in the manufacturing process of the semiconductor integrated circuit, the user who has purchased the wafer cannot identify the good and bad chips. Also in this case, the user can easily recognize a problem which occurred in the manufacturing process of the semiconductor integrated circuit.

Then, in step S24, it is judged whether the failure ratio of the semiconductor integrated circuit is less than a preset specification value. If the failure ratio exceeds the specification value (i.e., NG), for example, the purchased semiconductor integrated circuit is returned. When the semiconductor integrated circuit is returned from the user to a semiconductor maker, the semiconductor maker can easily specify the cause of a failure by confirming the presence or absence of the above unusual operation. Namely, the analysis time of the failure can be reduced. If the failure ratio does not exceed the specification value (i.e., OK), the acceptance inspection process ends.

As described above, in the first embodiment, by recognizing the unusual operation in the normal operation mode, it can be easily recognized that the semiconductor integrated circuit is bad. Therefore, the user who purchases the semiconductor integrated circuit can easily recognize a failure. Further, the unusual operation is disabled in the test mode, so that the maker of the semiconductor integrated circuit can easily perform the test of the semiconductor integrated circuit in the test process. As a result, it can be easily identified whether the semiconductor integrated circuit is a good product or not.

Figure 5:
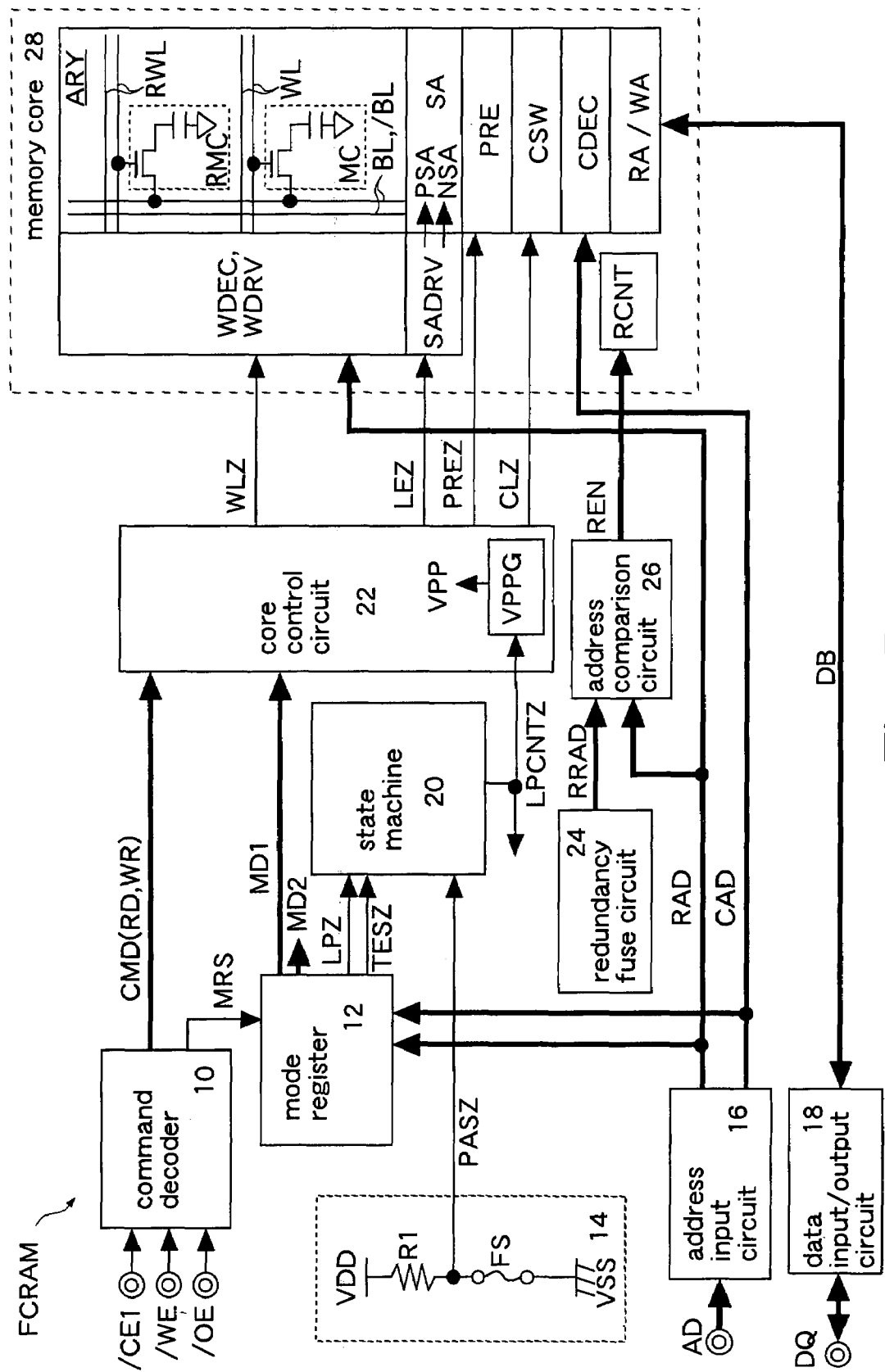
FIG. 5 is a block diagram showing a second embodiment of the present invention.

FIG. 5 shows a second embodiment of the present invention. A semiconductor integrated circuit of this embodiment is, for example, an FCRAM (Fast Cycle RAM) including DRAM memory cells and including an SRAM interface. The FCRAM includes a command decoder 10, a mode register 12 (mode setting circuit), a program circuit 14, an address input circuit 16, a data input/output circuit 18, a state machine 20, a core control circuit 22, a redundancy fuse circuit 24, an address comparison circuit 26, and a memory core 28. Further, the FCRAM includes a refresh timer, a refresh address counter, and so on, which are not shown, to automatically perform a refresh operation. Since the present invention does not relate to control of the refresh operation of a memory cell, circuits and operations related to the refresh operation will not be described.

The command decoder 10 outputs commands CMD recognized according to the logic levels of a chip enable signal /CE1, a write enable signal /WE, and an output enable signal /OE as a read command RD, a write command WR, a mode resister set command MRS, and so on to perform an access operation of the memory core 28. The read command RD and the write command WR are access commands (access requests) to allow the memory core 20 to perform the access operation. The mode register set command MRS is a command to set the mode register 12.

The mode register 12 is set, for example, in response to the address signal AD (RAD, CAD) supplied with the mode register set command MRS. The mode register 12 recognizes a low power command and a test mode command according to a set value and outputs a low power signal LPZ (a low power standby mode signal) and the test mode signal TESZ, respectively. The mode register 12 outputs other mode signals MD1, MD2 to change the operating specification of the FCRAM.

When the test mode signal TESZ is inactivated to the low logic level, the operation mode of the FCRAM is set to the normal operation mode. When the test mode signal TESZ is activated to the high logic level, the operation mode of the FCRAM is set to the test mode. As just described, the operation mode of the FCRAM is switched to the normal operation mode or the test mode by the test mode command. Incidentally, a shift to a low power mode is possible in both the normal operation mode and the test mode.

The program circuit 14 is the same circuit as the program circuit 1 shown in FIG. 1, and activates the pass signal PASZ when the fuse FS is programmed. As described in FIG. 1, the program circuit 14 is not limited to having the circuit configuration of FIG. 5. Further, the fuse FS is, for example, the fuse programmed by the overvoltage or the overcurrent. Alternatively, the fuse FS may be the fuse programmed by irradiation of the laser beam or may be constituted using the electrically programmable nonvolatile memory cell.

The address input circuit 16 receives the address AD and outputs the received address as a row address RAD and a column address CAD. The row address RAD is used to select a word line WL described later. The column address CAD is used to select bit lines BL, /BL.

The data input/output circuit 18 receives write data via a data terminal DQ and outputs the received data to a data bus D8. Further, the data input/output circuit 18 receives read data from a memory cell MC via the data bus DB and outputs the received data to the data terminal DQ.

The state machine 20 outputs a low power control signal LPCNTZ according to logic levels of the low power signal LPZ, the test mode signal TESZ, and the pass signal PASZ. When the low power control signal LPCNTZ is activated to a high logic level, the operation mode of the FCRAM is set to the low power mode. During the low power mode, the operation of a control circuit generating an internal voltage such as a control circuit VPPG is stopped, leading to a reduction in consumption current (power supply current, standby current). Further, during the low power mode, the operation of the refresh timer is also stopped.

The core control circuit 22 outputs a word line activation signal WLZ, a sense amplifier activation signal LEZ, a precharge control signal PREZ, and a column selection signal CLZ in response to the read command RD and the write command WR to allow the memory core 28 to perform a read operation and a write operation. The word line activation signal WLZ is a timing signal to control an activation timing of the word line WL. The sense amplifier activation signal LEZ is a timing signal to control an activation timing of a sense amplifier SA. The column selection signal CLZ is a timing signal to control an on-timing of a column switch CSW. The precharge control signal PREZ is a timing signal to control on/off of a precharge circuit PRE.

The core control circuit 22 includes the control circuit VPPG generating a boost voltage VPP which is a high level voltage of the word line WL. The control circuit VPPG operates to generate the boost voltage VPP during the inactivation of the low power control signal LPCNTZ and stops the operation during the activation of the low power control signal LPCNTZ (during the low power mode). The stop of the operation of the control circuit VPPG leads to a marked reduction in consumption current.

The redundancy fuse circuit 24 includes a fuse (second program unit) storing a redundancy row address RRAD (failure address) indicating the word line WL having a failure. For example, the fuse of the redundancy fuse circuit 24 is the fuse programmed by irradiation of the laser beam. Incidentally, the fuse of the redundancy fuse circuit 24 may be the fuse programmed by the overvoltage or the overcurrent as in the case of the fuse FS of the program circuit 14. The redundancy fuse circuit 24 outputs the redundancy row address RRAD according to a program state of the fuse. The address comparison circuit 26 outputs a redundancy enable signal REN when the row address RAD and the redundancy row address RRAD match.

The memory core 28 includes a memory cell array ARY, a word decoder WDEC, a word driver WDRV, a sense amplifier driver SADRV, the sense amplifier SA, the precharge circuit PRE, the column switch CSW, a column decoder CDEC, a read amplifier RA, a write amplifier WA, and a redundancy control circuit RCNT. The memory cell array ARY includes plural dynamic memory cells MC (real memory cells), plural redundancy memory cells RMC, word lines WL connected to the memory cells MC arranged in one direction, a redundancy word line RWL connected to the redundancy memory cells MC arranged in the one direction, and bit lines BL, /BL connected to the memory cells MC, RMC arranged in a direction perpendicular to the one direction. The redundancy memory cells RMC and the redundancy word line RWL are a redundancy circuit to relieve the failure.

The memory cells MC, RMC each include a capacitor to hold data as an electric charge and a transfer transistor one and the other of a source/drain of which are connected to the bit line BL (or /BL) and the capacitor (storage node), respectively. The other end of the capacitor is connected to a precharge voltage line VPR. A gate of the transfer transistor is connected to the word lines WL, RWL. The read operation and the write operation are performed by selecting the word lines WL, RWL.

The word decoder WDEC decodes the row address RAD to select the word lines WL, RWL. The word driver WDRV activates the word line WL or RWL in synchronization with the word line activation signal WLZ in response to a decoded signal outputted from the word decoder WDEC. The sense amplifier driver SADRV activates sense amplifier activation signals PSA, NSA in synchronization with the sense amplifier activation signal LEZ. The sense amplifier SA operates in synchronization with the sense amplifier activation signals PSA, NSA and amplifies a difference between signal amounts of data read to a bit line pair BL, /BL.

The precharge circuit PRE supplies a precharge voltage to the bit lines BL, /BL in response to the precharge control signal PREZ. The column address switch CSW is selectively turned on according to the column address CAD and connects the bit lines BL, /BL corresponding to the column address CAD to the read amplifier RA and the write amplifier WA. The column address decoder CDEC decodes the column address CAD to select the bit line pair BL, /BL to/from which data DQ is inputted/outputted. The read amplifier RA amplifies complementary read data outputted via the column switch CSW in a read access operation. The write amplifier WA amplifies complementary write data supplied via the data bus DB and supplies it to the bit line pair BL, /BL in a write access operation.

The redundancy control circuit RCNT disables driving of the real word line WL corresponding to the failure address stored in the redundancy fuse circuit 24 and instead enables driving of the redundancy word line RWL.

Figure 6:
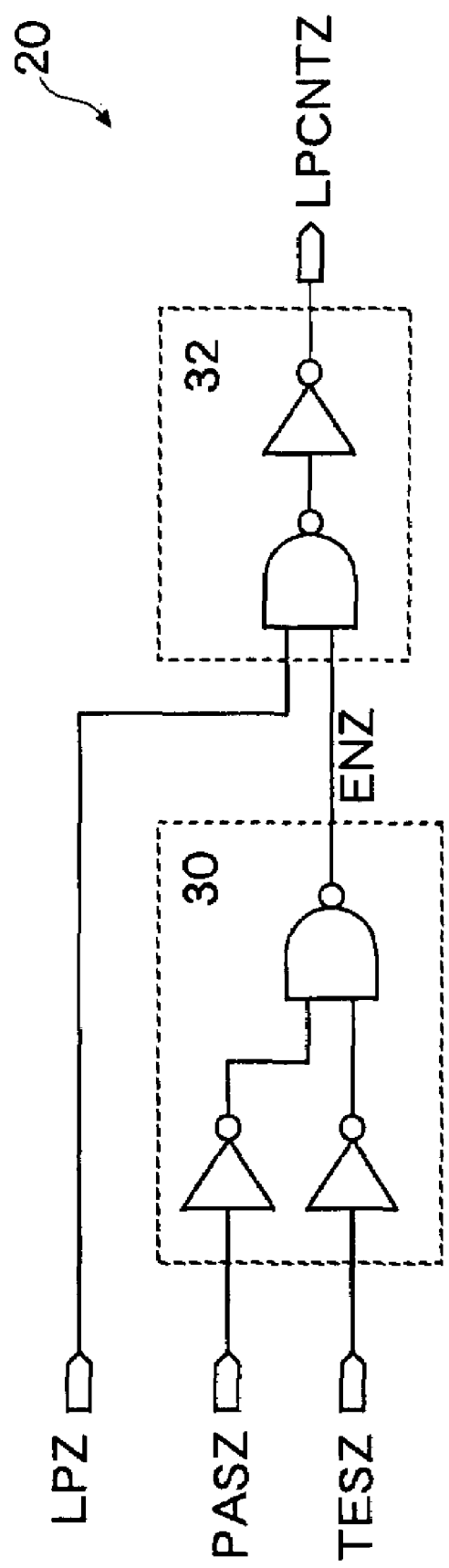
FIG. 6 is a circuit diagram showing details of a state machine shown in FIG. 5.

FIG. 6 shows details of the state machine 20 shown in FIG. 5. The state machine 20 includes an OR circuit 30 which is the same as the state machine 3 shown in FIG. 1 and an AND circuit 32. The OR circuit 30 calculates the OR logic of the pass signal PASZ and the test mode signal TESZ and outputs a calculation result as an enable signal ENZ. For example, the enable signal ENZ is activated to a high logic level H during the test mode (TESZ=high logic level) or when the pass signal PASZ is activated. The enable signal ENZ is inactivated during the normal operation mode (TESZ=low logic level) or when the pass signal PASZ is inactivated to the low logic level.

The AND circuit 32 sets the logic level of the low power control signal LPCNTZ to the same logic level as that of the low power signal LPZ when the enable signal ENZ is activated. The AND circuit 32 inactivates the low power control signal LPCNTZ to a low logic level when the enable signal ENZ is inactivated.

FIG. 7 shows the operation of the state machine 20 shown in FIG. 6. During the normal operation mode (TESZ=L), the enable signal ENZ is set to the same level as the logic level of the pass signal PASZ. Therefore, when the semiconductor integrated circuit is a bad chip (PASZ=L), the enable signal ENZ is inactivated, and the low power control signal LPCNTZ is set to the low logic level regardless of the logic level of the low power signal LPZ as shown by the heavy-line frame in the figure. Namely, even if the low power signal LPZ is set to the high logic level H (low power mode) by the setting of the mode register 12, the low power control signal LPCNTZ is not activated. Even if the setting to the low power mode is made, for example, the control circuit VPPG shown in FIG. 5 does not stop its operation, and the consumption current (power supply current) becomes larger compared to the normal lower power mode. Namely, the FCRAM performs the unusual operation during the normal operation mode.

On the other hand, during the test mode (TESZ=H), the enable signal ENZ is always activated to the high logic level H regardless of the logic of the pass signal PASZ. The low power control signal LPCNTZ changes according to the lower power signal LPZ. Namely, during the test mode, the FCRAM always performs the normal operation regardless of whether it is a bad chip or a good chip.

Figure 8:
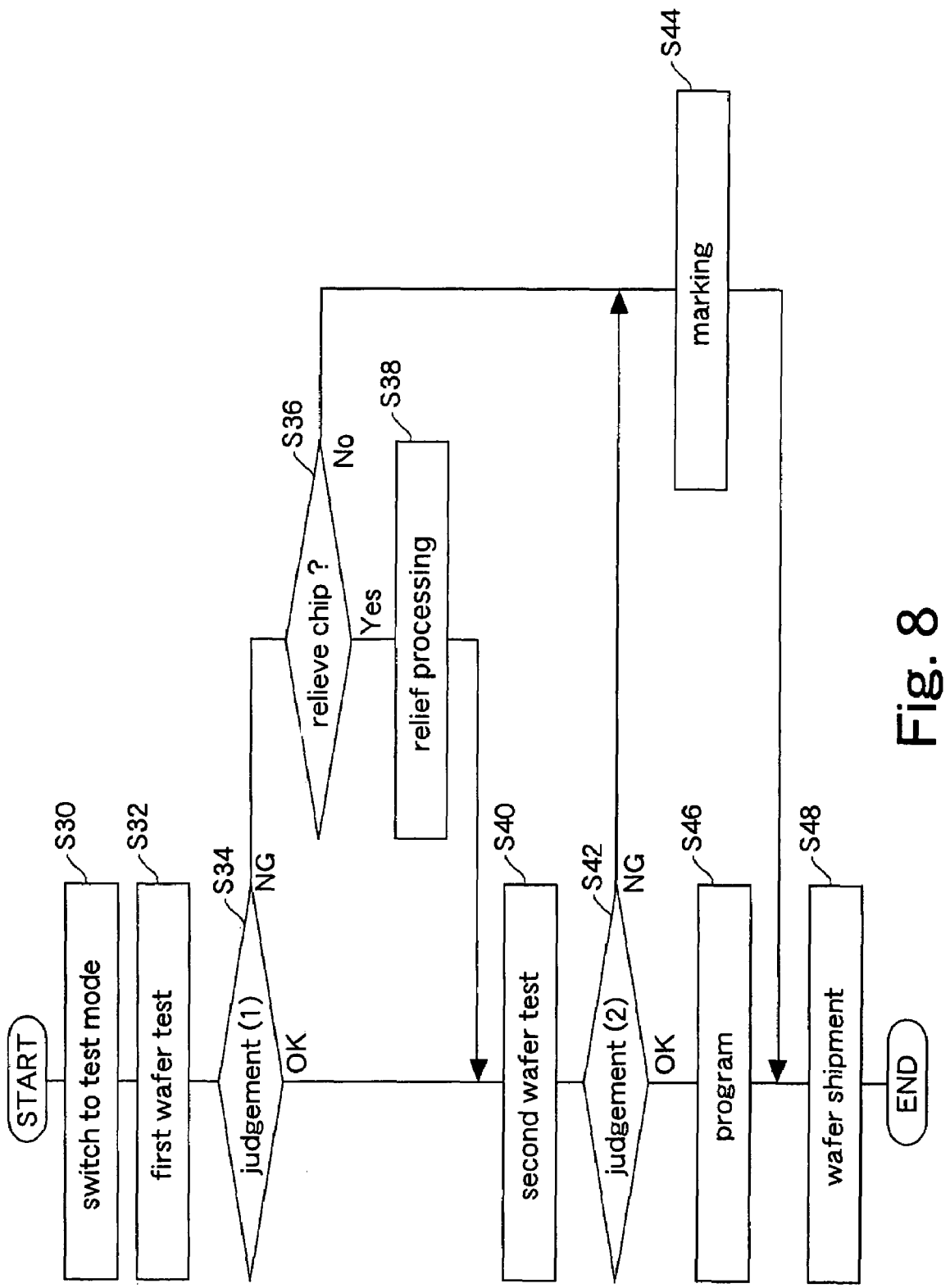
FIG. 8 is a flowchart showing a testing method of a semiconductor integrated circuit of the second embodiment.

FIG. 8 shows a flow of a testing method of the semiconductor integrated circuit in the second embodiment. This flow is performed in the manufacturing process of the FCRAM in the wafer state. Steps S32, S34, S36, S40, S42 are a test process using the LSI tester. Steps S38, S46 are each a programming process using a programming apparatus of a fuse. Step S44 is a marking process using an ink-marking apparatus. Incidentally, when the fuse FS of the program circuit 14 is the fuse programmed by the overvoltage or the overcurrent, the programming process of step S46 can be performed by the LSI tester.

First, in step S30, the mode register command MRS is supplied to the FCRAM, and the FCRAM is switched from the normal operation mode to the test mode. Then, in step S32, a first wafer test process of testing an internal circuit of the memory core 28 or the like is performed. In the first wafer test process, it is judged whether the failure can be relieved by the redundancy memory cell RMC and the redundancy word line RWL. Subsequently, in step S34, it is judged based on a result of the first wafer test process whether the FCRAM is a good chip or a bad chip. If the FCRAM is the bad chip (i.e., NG), it is further judged in step S36 whether the bad chip is relievable by the redundancy circuit. If it is relievable (i.e., Yes), in step S38, the failure address is programmed into the redundancy fuse circuit. If it is not relievable (i.e., No), the bad chip is marked with ink or a failure map file indicating the position of the bad chip on a wafer is created. Namely, the FCRAM whose failure is judged to be relievable is relieved. Back to step S34, if the FCRAM is a good chip (i.e., OK), the process goes to step S40, where a second wafer test is performed.

Then, in step S40, to confirm that the failure is relieved, a second wafer test process is performed. Subsequently, in step S42, it is judged based on a result of the second wafer test process whether the FCRAM is a good chip or a bad chip, and it is confirmed that the failure is relieved. If the FCRAM is the bad chip, in step S44, this FCRAM together with unrelievable bad chips is marked with ink. If the FCRAM is the good chip, in step S46, only in the FCRAM (good chip) which has passed the test, the fuse FS are programmed. Then, in step S48, the FCRAM (wafer) is shipped.

By performing the programming process after the last second wafer test process out of plural sub-wafer test processes, the fuse FS is programmed only in all good chips. Accordingly, during the normal operation mode, all the good chips perform the normal operation, and all the bad chips perform the unusual operation. Incidentally, the acceptance inspection by the user who purchases the FCRAM is the same as that in FIG. 4. In the acceptance inspection, in the normal operation mode, the FCRAM is set to the low power mode, and the power supply current is measured. A chip whose power supply current is larger than a specification value is judged to be bad. Hence, the user can easily identify the good chip or the bad chip.

As described above, also in the second embodiment, the same effect as in the above first embodiment can be obtained. Further, in this embodiment, the bad FCRAM performs the unusual operation (passes an unusual current) only during the low power mode in the normal operation mode. This unusual current is a normal current if not during the low power mode. As just described, part of the normal operation of the FCRAM becomes the unusual operation in the special operation mode (low power mode). Therefore, even when a product (system) on which the bad FCRAM is mounted is assembled and the FCRAM performs the unusual operation while the system is operating, the unusual current falls within a range acceptable by the system. As a result, the influence of the unusual operation of the FCRAM on the operation of the system can be minimized.

Figure 9:
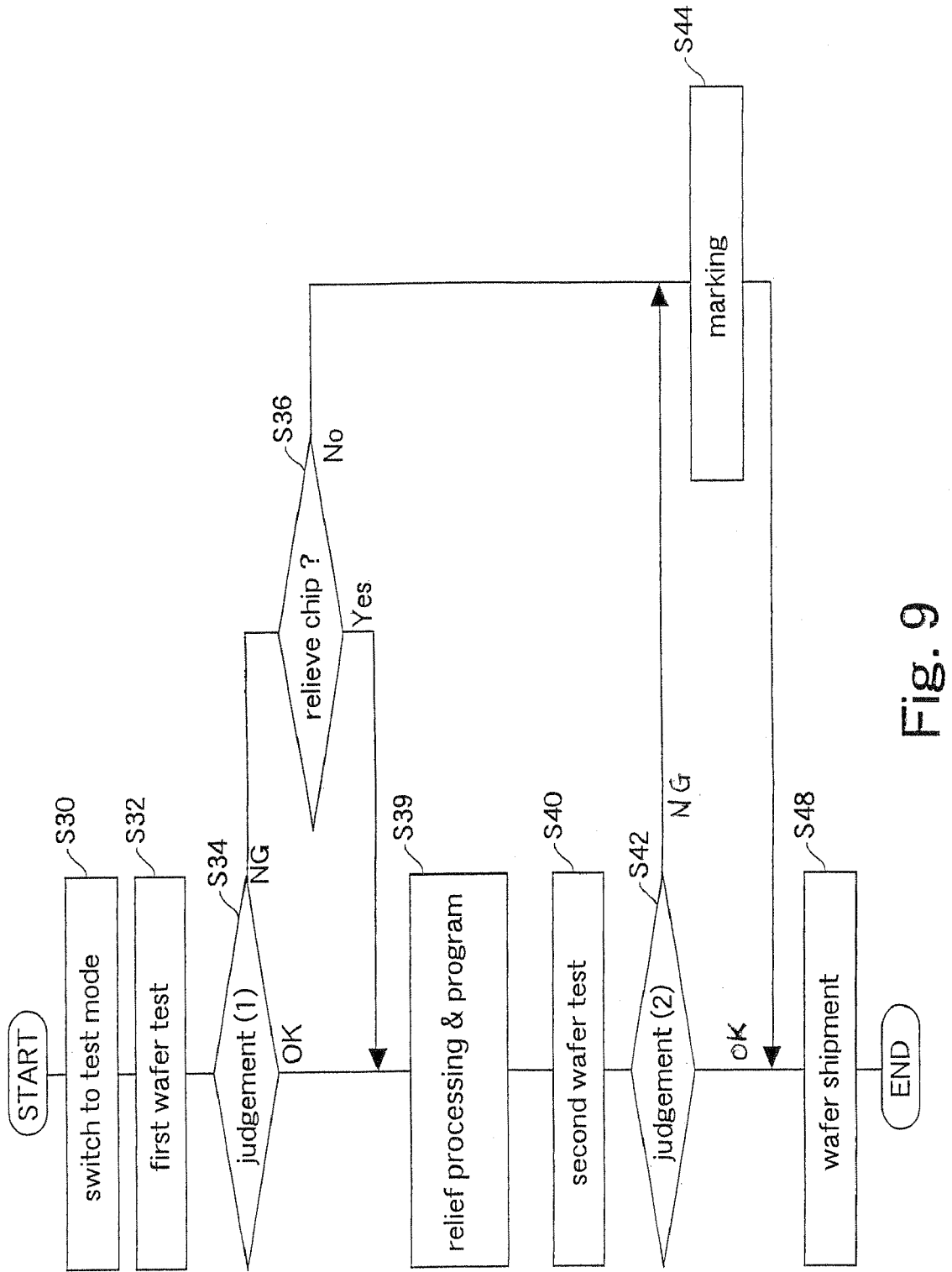
FIG. 9 is a flowchart showing a testing method of a semiconductor integrated circuit of a third embodiment.

FIG. 9 shows a flow of a testing method of a semiconductor integrated circuit in a third embodiment of the present invention. The same symbols are used to designate the same elements as those described in the first and second embodiments, and a detailed description thereof is omitted. In this embodiment, a test is performed using the FCRAM of the second embodiment. However, the fuse FS of the program circuit 14 and the fuse of the redundancy fuse circuit 24 shown in FIG. 5 are fuses of the same material. These fuses are the fuses programmed by irradiation of the laser beam.

In this embodiment, steps S38, S46 in FIG. 8 are eliminated, and step S39 is newly added. The other steps are the same as in FIG. 8. In step S39, relief processing of programming the failure address into the redundancy fuse circuit and the programming process of the fuse FS are performed using the same laser programming apparatus. At this time, even if the FCRAM is judged to be a good chip (including a relievable chip) in the first wafer test process and the fuse FS is programmed, it is sometimes judged to be a bad chip in the second wafer test process.

However, when the detailed test is performed in the first wafer test process of step S32 and the yield of the FCRAMs relieved using the redundancy fuse circuits 24 is high, the number of FCRAMs judged to be bad in step S42 is small. In other words, if the failure ratio of FCRAMs judged to be bad in step S42 is lower than a preset value, the relief processing and the programming of the fuse FS can be performed in the same process.

As described above, also in the third embodiment, the same effects as in the above first and second embodiments can be obtained. Further, in this embodiment, by performing the relief processing and the programming of the fuse FS in the same process, the number of programming processes can be reduced from two to one. As a result, the test cost can be reduced, resulting in a reduction in the manufacturing cost of the FCRAM.

Figure 10:
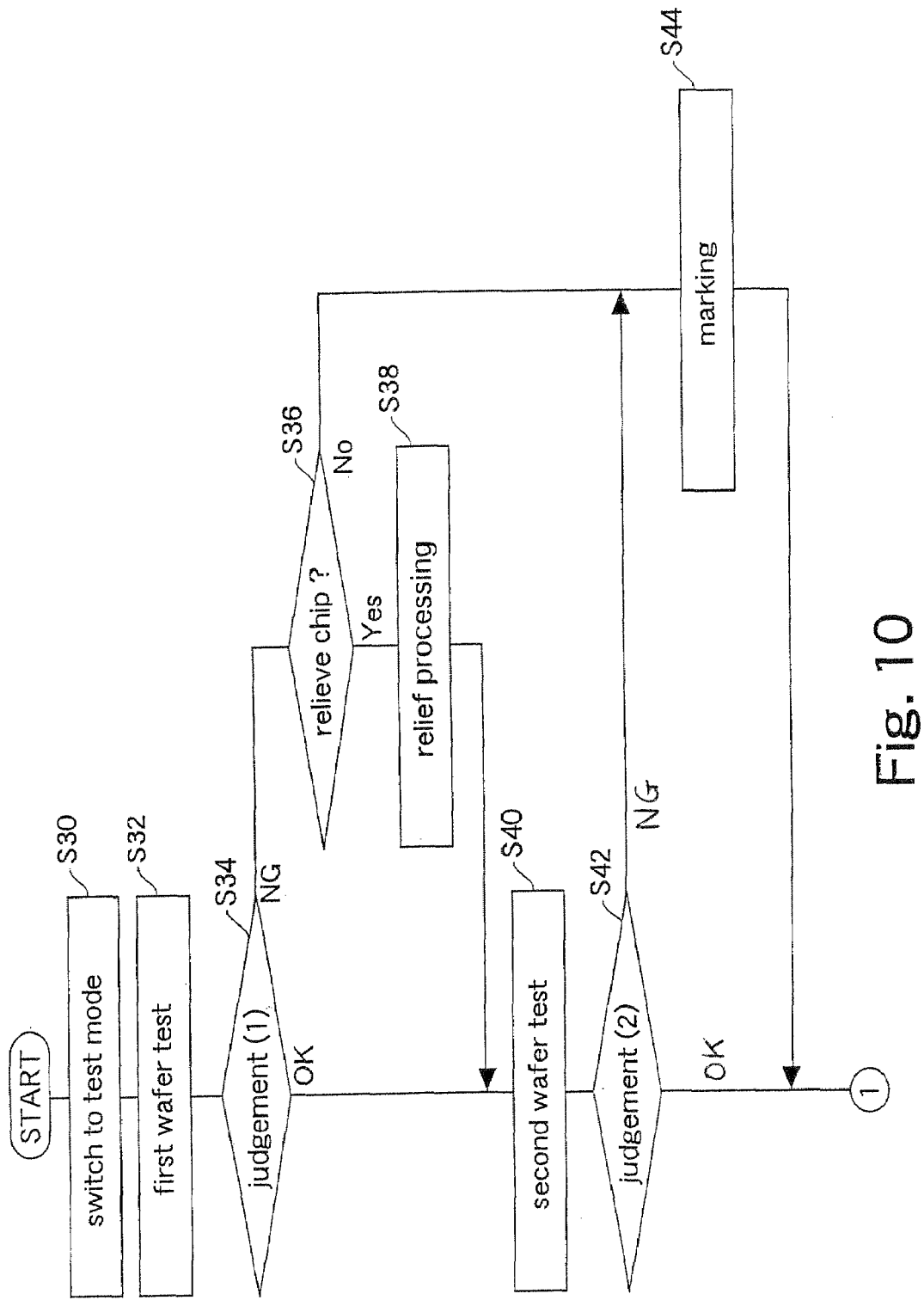
FIG. 10 is a flowchart showing a testing method of a semiconductor integrated circuit of a fourth embodiment.
Figure 11:
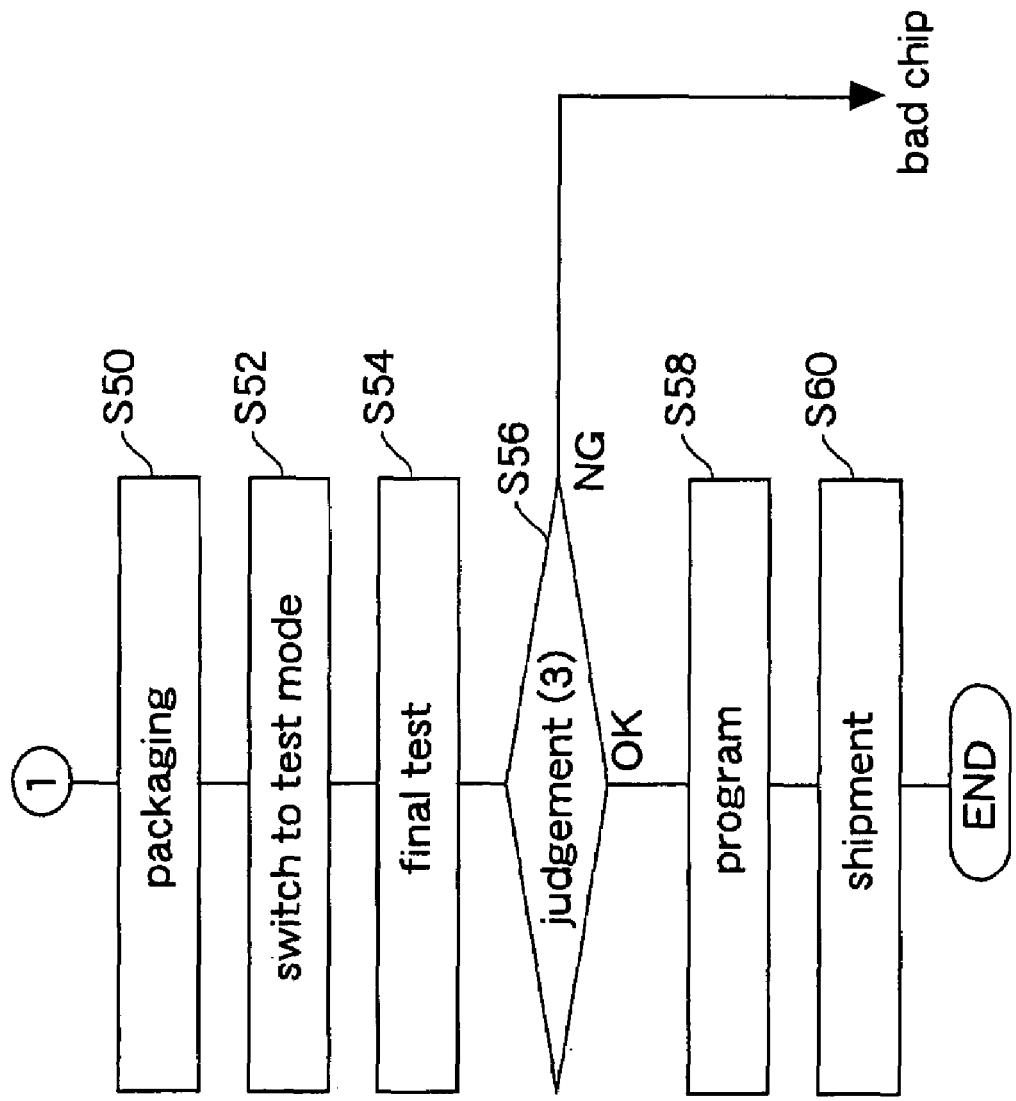
FIG. 11 is a flowchart showing a testing method of the semiconductor integrated circuit of the fourth embodiment.

FIG. 10 and FIG. 11 show flows of testing methods of a semiconductor integrated circuit in a fourth embodiment of the present invention. The same symbols are used to designate the same elements as those described in the first and second embodiments, and a detailed description thereof is omitted. In this embodiment, a test is performed using the FCRAM of the second embodiment. FIG. 10 shows a testing method of the FCRAM in the wafer state. FIG. 11 shows a testing method of the packaged FCRAM. The FCRAM is shipped after the flow shown in FIG. 11. The flow of FIG. 10 is constituted by eliminating the programming process of step S46 from the flow of FIG. 8. The flow other than this is the same as in FIG. 8.

In FIG. 11, first in step S50, the FCRAMs in the wafer state are diced, and only the FCRAM which has passed the second wafer test process shown in FIG. 10 is packaged (packaging process). Whether or not the FCRAM has passed the second wafer test process is judged by the ink mark put on the FCRAM in the wafer state. Alternatively, it is judged by the failure map file indicating the position of the bad chip on the wafer.

Then, in step S52, the mode register command MRS is supplied to the FCRAM, and the FCRAM is switched from the normal operation mode to the test mode. Subsequently, in step S54, a final test (third test process) of confirming the operation of the packaged FCRAM is performed. Thereafter, in step S56, it is judged based on a result of the final test whether the FCRAM is a good product or a bad product. If the FCRAM is the bad product, it is discarded. If the FCRAM is the good product, in step S58, the fuse FS of the program circuit 14 is programmed. Incidentally, the fuse FS is the fuse programmed by the overvoltage or the overcurrent. Therefore, even after the FCRAM chip is packaged, the fuse FS is programmable using the LSI tester or the like. Then, in step S60, the FCRAM is shipped.

By performing the programming process after the final test, the fuse FS is programmed only in all good products. Accordingly, during the normal operation mode, all the good products perform the normal operation, and all the bad products perform the unusual operation. Incidentally, the acceptance inspection by the user who purchases the FCRAM is the same as that in FIG. 4. In the acceptance inspection, in the normal operation mode, the FCRAM is set to the low power mode, and the power supply current is measured. A chip whose power supply current is larger than the specification value is judged to be bad. Hence, the user can easily identify the good chip or the bad chip. As described above, also in the fourth embodiment, the same effects as in the above first and second embodiments can be obtained.

Figure 12:
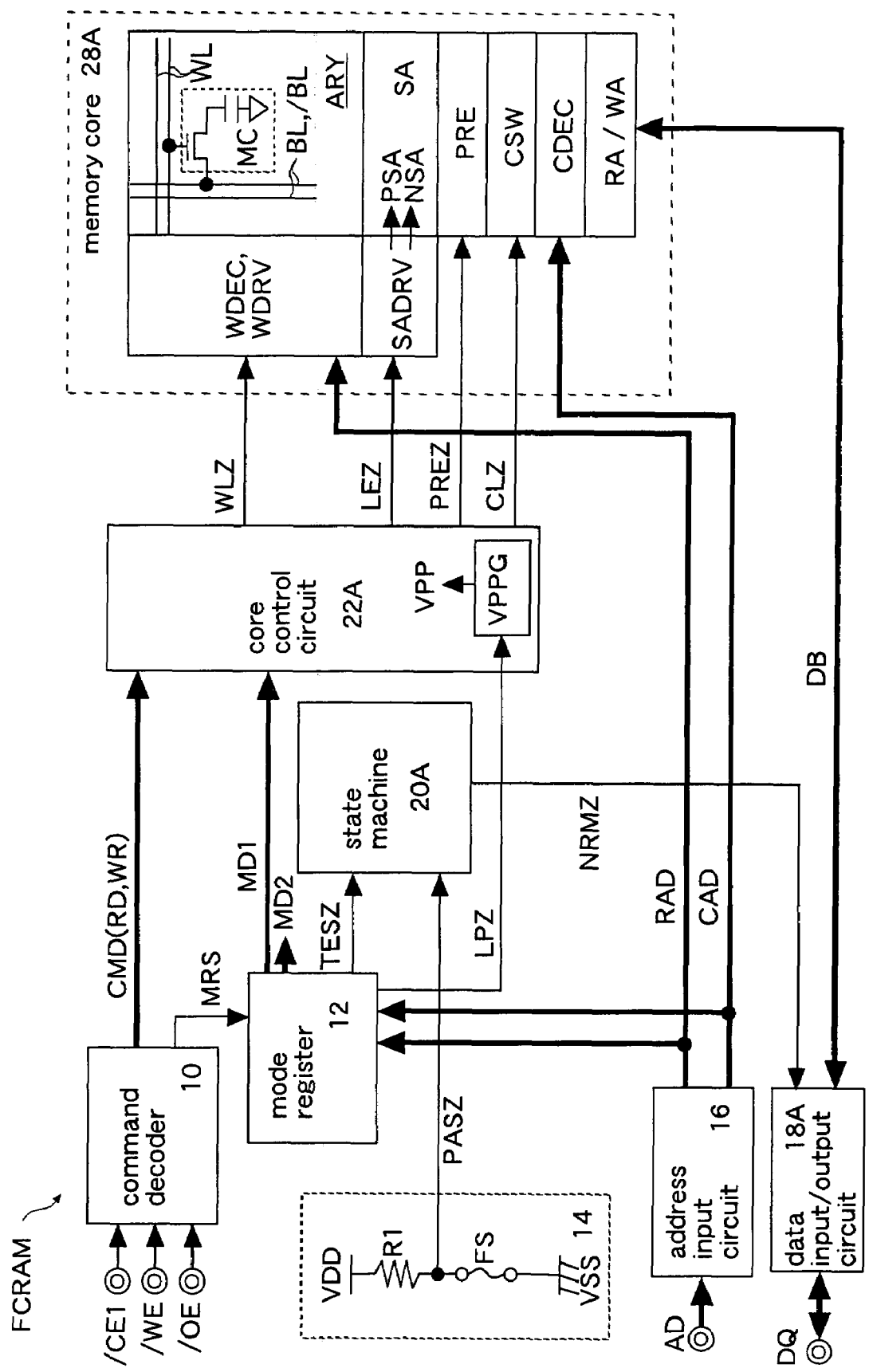
FIG. 12 is a block diagram showing a fifth embodiment of the present invention.

FIG. 12 shows a fifth embodiment of the present invention. The same symbols are used to designate the same elements as those described in the first and second embodiments, and a detailed description thereof is omitted. An FCRAM of this embodiment includes a data input/output circuit 18A, a state machine 20A, a core control circuit 22A, and a memory core 28A instead of the data input/output circuit 18, the state machine 20, the core control circuit 22, and the memory core 28 of the second embodiment (FIG. 5). Further, the redundancy fuse circuit 24 and the address comparison circuit 26 of the second embodiment are eliminated. The other constitutions are the same as in the second embodiment.

The state machine 20A outputs the normal signal NRMZ according to the logic levels of the test mode signal TESZ and the pass signal PASZ. The data input/output circuit 18A outputs read data supplied from the memory core 28A via the data bus DB to the data terminal DQ when the normal signal NRMZ is activated. On the other hand, the data input/output circuit 18A performs the unusual operation by disabling the output of the read data to the data terminal DQ when the normal signal NRMZ is inactivated.

The control circuit VPPG of the core control circuit 22A operates to generate the boost voltage VPP when the low power signal LPZ from the mode register 12 is inactivated, and stops the operation during the activation of the low power signal LPZ (during the low power mode). The other constitutions of the core control circuit 22A are the same as those of the core control circuit 22 of the second embodiment. The memory core 28A is constituted by eliminating the redundancy control circuit RCNT, the redundancy word line RWL, the redundancy memory cells RMC from the memory core 28 of the second embodiment.

Figure 13:
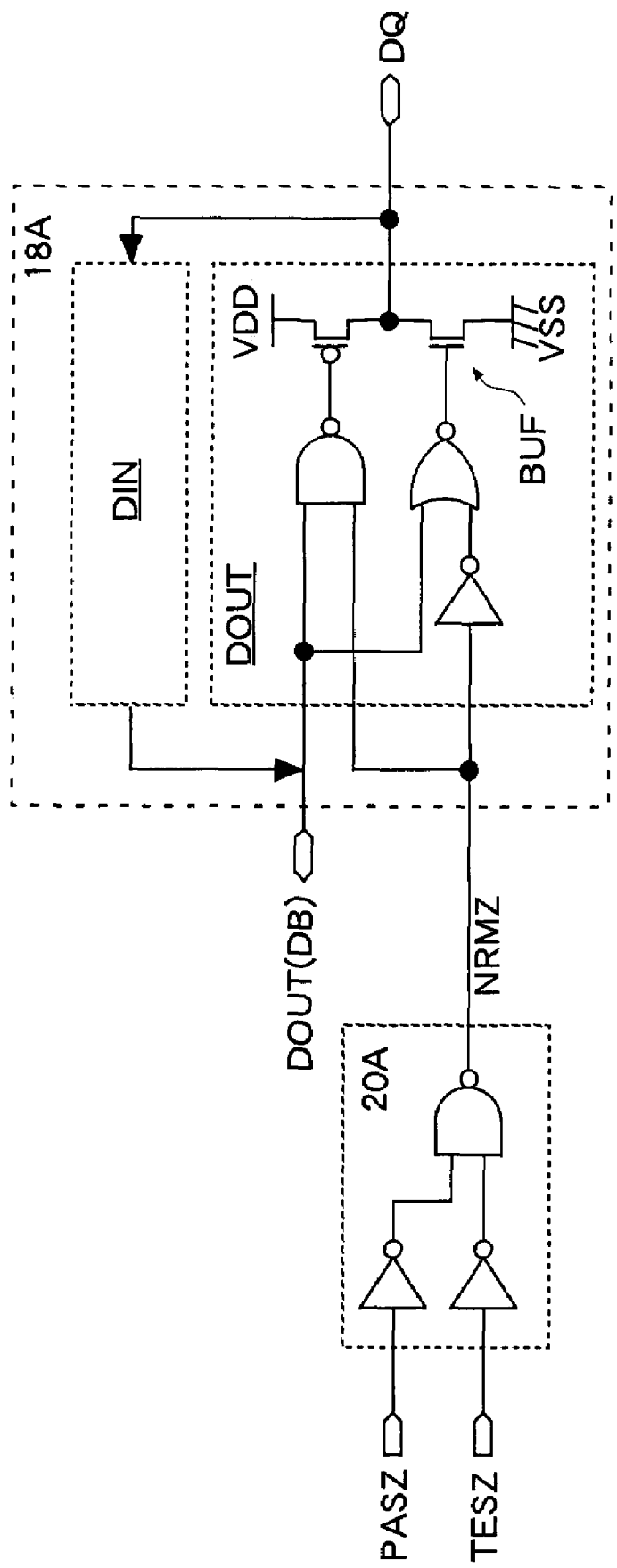
FIG. 13 is a circuit diagram showing details of a state machine and a data input/output circuit shown in FIG. 12.

FIG. 13 shows details of the state machine 20A and the data input/output circuit 18A shown in FIG. 12. The state machine 20A is the same as the state machine 3 of the first embodiment. Therefore, by replacing the "operation of the circuit 4a" in FIG. 2 described above with the "operation of the data input/output circuit 18A", the operation of the state machine 20A can be described. Namely, the state machine 20A allows the data input/output circuit 18A to perform the unusual operation different from the normal operation when the pass signal PASZ is inactivated during the normal operation mode, and disables the unusual operation of the data input/output circuit 18A and allows it to perform the normal operation during the test mod or when the pass signal PASZ is activated.

The data input/output circuit 18A includes a data output circuit DOUT outputting the read data from the data bus DB to the data terminal DQ and a data input circuit DIN outputting write data received by the data terminal DQ to the data bus DB. In the figure, the data input/output circuit 18A corresponding to the one-bit data terminal DQ is shown.

The data output circuit DOUT includes an output buffer BUF, and an inverter, a NAND gate, and a NOR gate controlling the operation of the output buffer BUF. The output buffer BUF includes a pMOS transistor and an nMOS transistor connected in series between the power supply line VDD and the ground line VSS. A connection node between the PMOS transistor and the nMOS transistor is connected to the date terminal DQ. The output buffer BUF sets the data terminal DQ to a high logic level (VDD) or a low logic level (VSS) according to the logic level of the data bus DB when the normal signal NRMZ is activated to the high logic level. On the other hand, the output buffer BUF turns off the pMOS transistor and the nMOS transistor when the normal signal NRMZ is inactivated to the low logic level. By tuning off the pMOS transistor and the nMOS transistor, the data terminal DQ is set to a floating state regardless of the value of the data bus DB. Namely, the data output circuit DOUT normally outputs data when the normal signal NRMZ is activated, and, when the normal signal NRMZ is inactivated, performs the unusual operation by disabling the output of data and setting the data terminal DQ to the floating state. This unusual operation is recognizable from outside the FCRAM by monitoring the signal value of the data terminal DQ.

As described above, also in the fifth embodiment, the same effects as in the above first and second embodiments can be obtained. Further, in this embodiment, by allowing the data output circuit OUT to perform the unusual operation according to the test mode signal TESZ and the pass signal PASZ, it can be easily recognized that the FCRAM is bad. The data signal is not outputted at all when the normal signal NRMZ is inactivated. Therefore, by performing a write operation and a read operation on the FCRAM using a simple testing apparatus, it can be recognized that the FCRAM is bad.

Incidentally, in the above second to fifth embodiments, the example in which the present invention is applied to a semiconductor memory such as the FCRAM is described. The present invention is not limited to these embodiments. For example, the present invention may be applied to a logic LSI such as a microcomputer. Further, in the fifth embodiment, the redundancy fuse circuit 24, the address comparison circuit 26, the redundancy control circuit RNCT, the redundancy memory cells MC, the redundancy word line RWL, and so on of the second embodiment may be formed. Furthermore, the FCRAM to which the present invention is applied may be a clock synchronous type SDRAM type instead of the SRAM type.

In the above fifth embodiment, the example in which the output of data is disabled when the normal signal NRMZ is inactivated is described. The present invention is not limited to this embodiment. For example, when the normal signal NRMZ is inactivated, data fixed to a high logic level may be outputted or data fixed to a low logic level may be outputted.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor integrated circuit, comprising:
    a program circuit including a first program unit which is programmed when a test of an internal circuit is passed and activating a pass signal by the programming of said first program unit;
    a mode setting circuit allowed to switch an operation mode between a normal operation mode and a test mode by external control; and
    a state machine allowing a partial circuit of said internal circuit to perform an unusual operation different from a normal operation when said pass signal is inactivated during said normal operation mode, and disabling said unusual operation of said partial circuit and allowing it to perform said normal operation during said test mode or when said pass signal is activated, wherein
    said unusual operation is an operation recognizable from outside the semiconductor integrated circuit.

2. The semiconductor integrated circuit according to claim 1, further comprising
a data output circuit outputting data from said internal circuit as said partial circuit, wherein
said data output circuit performs said unusual operation by disabling the output of the data when said pass signal is inactivated during said normal operation mode, and outputs the data during said test mode or when said pass signal is activated.

3. The semiconductor integrated circuit according to claim 1, wherein
said first program unit comprises a fuse programmed by irradiation of a laser beam.

4. The semiconductor integrated circuit according to claim 1, wherein
said first program unit comprises a fuse programmed by an overvoltage or an overcurrent.

5. The semiconductor integrated circuit according to claim 1, wherein
said first program unit comprises an electrically programmable nonvolatile memory cell.

6. The semiconductor integrated circuit according to claim 1, further comprising:
a real memory cell and a redundancy memory cell;
a second program unit storing a failure address indicating a bad real memory cell; and
a redundancy control circuit disabling an access to said real memory cell and instead enabling an access to said redundancy memory cell when an address supplied to access said real memory cell is the failure address stored in said second program unit, wherein
said first and second program units comprise fuses of a same material.

7. The semiconductor integrated circuit according to claim 1, wherein
said unusual operation is an operation which consumes a larger power supply current than a power supply current in said normal operation.

8. The semiconductor integrated circuit according to claim 7, further comprising
a low power mode a shift to which is possible during said normal operation mode and said test mode and in which an operation of a control circuit in said internal circuit is stopped, wherein
said unusual operation is performed only during said low power mode when said pass signal is inactivated during said normal operation mode.

9. A testing method of a semiconductor integrated circuit which includes a mode setting circuit allowed to switch an operation mode between a normal operation mode and a test mode by external control, a program circuit activating a pass signal when a built-in first program unit is programmed, and an internal circuit performing an unusual operation different from a normal operation when said pass signal is inactivated during said normal operation mode, comprising:
a test process of performing switching from said normal operation mode to said test mode by setting of said mode setting circuit and testing said internal circuit; and
a programming process of programming said first program unit only in the semiconductor integrated circuit which has passed the test.

10. The testing method of the semiconductor integrated circuit according to claim 9, wherein
said test process comprises plural sub-test processes, and
said programming process is performed after a last sub-test process.

11. The testing method of the semiconductor integrated circuit according to claim 9, wherein
said test process comprises:
a first test process of judging whether a failure is relievable by a redundancy circuit;
a relieving process of relieving the semiconductor integrated circuit whose failure is judged to be relievable; and
a second test process of confirming that the failure has been relieved, wherein
said programming process, together with said relieving process, is performed before said second test process.

12. The testing method of the semiconductor integrated circuit according to claim 9, wherein
said test process and said programming process are performed on the semiconductor integrated circuit in a wafer state.

13. The semiconductor integrated circuit according to claim 9, wherein
said test process comprises:
a first test process of judging whether a failure is relievable by a redundancy circuit;
a relieving process of relieving the semiconductor integrated circuit whose failure is judged to be relievable;
a second test process of confirming that the failure has been relieved;
a packaging process of packaging the semiconductor integrated circuit which has passed the second test process; and
a third test process of confirming an operation of the packaged semiconductor integrated circuit, wherein
said programming process is performed after said third test process.

14. The testing method of the semiconductor integrated circuit according to claim 13, wherein
said programming process is performed by programming said first program unit including a fuse which is programmed by an overvoltage or an overcurrent.

* * * * *